(12) United States Patent
Brandt (10) Patent No.: US 6,583,524 B2
(45) Date of Patent: Jun. 24, 2003

(54) MICRO-MOVER WITH BALANCED DYNAMICS

(75) Inventor: Jobst Brandt, Palo Alto, CA (US)

(73) Assignee: Hewlett-Packard Company, Palo Alto, CA (US)

( * ) Notice: Subject to any disclaimer, the term of this patent is extended or adjusted under 35 U.S.C. 154(b) by 201 days.

(21) Appl. No.: 09/800,560

(22) Filed: Mar. 7, 2001

(65) Prior Publication Data

US 2002/0125789 A1 Sep. 12, 2002

(51) Int. Cl.[7] .................................................. H02N 1/00
(52) U.S. Cl. ........................ 310/12; 310/309; 360/78.05; 360/78.12; 318/116
(58) Field of Search .................... 310/309, 12, 40 MM; 318/116; 360/78.05, 78.12, 264.5, 294.3; 257/420

(56) References Cited

U.S. PATENT DOCUMENTS

| | | | |
|---|---|---|---|
| 5,834,864 A | 11/1998 | Hesterman et al. | 310/40 |
| 5,986,381 A | 11/1999 | Hoen et al. | 310/309 |

*Primary Examiner*—Karl Tamai

(57) ABSTRACT

A micro-mover system includes an information storage unit having multiple pairs of parallel plates closely spaced from each other to enable the exchange of information. A micro electromechanical system (MEMS) motor is associated with each pair of plates to move one of each pair of parallel plates in a plane parallel to the other plate in each pair to facilitate the exchange of information between each pair of plates. One pair of parallel plates is oriented to move in a direction opposite to another pair of parallel plates. Control circuitry is associated with each MEMS motors to coordinate the plate pair movements associated with that motor, so that the motion of one plate in one set of parallel plates occurs at the same time and in a direction opposite to the movement of the one plate of another set of parallel plates, thereby canceling a substantial level of total momentum arising from movement within the micro-mover system.

A method of storing information in a memory storage system utilizes a plurality of pairs of plates, where each pair of plates is associated with a micro-mover for moving at least one plate relative to the other plate in each pair of plates. Plates in each of adjacent plate pairs move in directions opposite to each other along a common axis for the same distance and time, so that the momenta of the plate pairs are approximately equal and cancel each other.

24 Claims, 6 Drawing Sheets

MICRO-MOVER WITH BALANCED DYNAMICS

BACKGROUND OF THE INVENTION

1. Field of Invention

The present invention pertains to the field of micro-movers for information storage. More particularly, this invention relates to providing micro-movers for parallel plate information storage devices wherein the movement of an array of micro-movers is coordinated to balance dynamics.

2. Background

Memory devices using parallel plates with read-write transducers on one plate and a recording medium on the other plate usually require micro-movers to drive planar motion of the plates relative to each other. The combined motion of plates in the X and Y directions enhance data transfer rates to and from the recording medium. Micro electro mechanic system (MEMS) motors are used to move plates relative to each other. Such a MEMS motor is shown in U.S. Pat. No. 5,986,381 granted to Hoen et al. on Nov. 16, 1999 in which an array of drive electrodes is mounted on a surface of one member and an array of matching driven electrodes is disposed on an opposing surface of a second member. Voltage patterns on the drive electrodes and driven electrodes cause the members to move relative to each other. The spacing, number, pitch and voltages on the electrodes control movement of one member relative to the other.

In order to achieve the high information density and speed required of current information storage systems, great accuracy and speed are required in the movements of the plates with tight control over the ranges of motion in the all three X, Y and Z orthogonal directions. An example of such a high-speed precisely controlled micro-mover motor used with an information storage system is described in U.S. Pat. No. 5,834,864 granted to Hesterman et al. on Nov. 10, 1998. This system provides for at least one pair of silicon plates, one having read-write elements and the other providing a plurality of information storage areas. One or both the plates includes a structure of etched silicon springs controlling the range and resilience of movement of the plate in the X direction or the Y direction. Another embodiment uses silicon springs on a single plate to control movement in both X and Y directions.

Micro-movers are generally micro-machined in multiples on a single chip, oriented in an orthogonal pattern. Typically, groups of micro-movers on a chip utilize a single drive control and may move simultaneously. Plates, such as those shown in Hesterman et al. may do random seeks or may oscillate in a direction at or near resonance, such as 1000 Hz. Typical plates may have up to 10,000 transducers in a 100×100 array. Data is transferred in parallel bytes, with as many as 300–400 plates moving simultaneously at accelerations up to 50 Gs. Since each plate may have a moving mass of about 35 milligrams, considerable vibration can be generated by MEMS driven storage units in operation. These mechanical stresses may lead to premature wear on the MEMS motors and possible inaccuracies in data transfer.

The problem of imbalance and vibration is increased in applications that typically operate in a vacuum to minimize interference from stray particles. The absence of atmospheric damping increases the likelihood of vibration from multiple simultaneous operating micro-movers. The delicacy of operations and structure at atomic resolution levels can be dramatically affected by vibration amounts that would not be a problem at a less miniature scale. Accordingly, coordinating and controlling the simultaneous movement of the information storage components are needed to provide dynamic balance for MEMS micro-movers.

SUMMARY OF THE INVENTION

The present invention provides for a plurality of micro-movers coordinated to move in opposing directions to provide dynamic balance to a MEMS driven information storage system. Preferably an even number of micro-motors move opposite to each other to cancel inertial imbalance in the system. Alternately, in the event that different plates have different moving masses, the movement of the micro-motors is coordinated to provide equal momentum in opposing directions of the moving masses.

Since plates and micro-motors typically move in both X and Y directions, opposing motions of plates must be coordinated in X and Y directions. Simultaneous information transfer occurs in bytes utilizing two quadrants that can make use of four plates each. Thus, a preferred embodiment of the present invention utilizes sets of four plates driven by their respective micro-movers to move together in opposing directions. To avoid undesirable torque, one plate of a first coordinated plate pair is disposed on a first common axis with a plate of a second coordinated plate pair. The other plate of the first plate pair is disposed on a second common axis with a plate of a third coordinated plate pair. Other plates in the array are similarly disposed to minimize the vibration of the system caused by the momentum of moving plates. In order to accommodate the opposing motions of plates, logic circuitry modifies data flow in order to accommodate opposing motions and make data appear to be contiguous.

A micro-mover system according to the present invention preferably includes a first information storage unit having a first pair of parallel plates closely spaced from each other and disposed relative to each other to enable the exchange of information. A first micro electromechanical system (MEMS) motor is associated with the first information storage unit to move at least one of the first pair of parallel plates in a first plane parallel to the other plate of the first pair to facilitate the exchange of information between the first pair of plates.

A second information storage unit has a second pair of parallel plates closely spaced from each other and disposed relative to each other to enable the exchange of information. The second pair of parallel plates is oriented with respect to the first pair of parallel plates to develop counter movement in opposing directions. A second MEMS motor is associated with the second information storage unit to move at least one of the parallel plates along one of the opposing directions and in a second plane parallel to the other plate of the second pair to facilitate the exchange of information between the second pair of plates.

Control circuitry is associated with the first and second MEMS motors to coordinate the movement of the first and second pairs of plates, so that the motion of the one of the second set of parallel plates along one of the opposing directions occurs at the same time and in a direction opposite to the movement of the one of the first set of parallel plates to thereby cancel a substantial level of total momentum arising from movement within the micro-mover system.

In another preferred embodiment of the present invention, a first group of selected plate pairs includes a first plate moving in a first direction aligned along a common axis with a second plate in a second group of selected plate pairs. The second plate moves in an opposing direction to the first plate, so that opposing movements of the first and second plates are aligned on a common axis to prevent torque forces.

Another preferred embodiment of the present invention comprises a method of storing information in a memory storage system having a plurality of pairs of plates. Each pair of plates is associated with a micro-mover for moving at least one plate relative to the other plate in each pair of plates. A first plate in a first pair of plates is moved in a first direction with a first momentum. A second plate in a second pair of plates is moved in a direction opposite to the first direction with a second momentum approximately equal to the first momentum. The movement of the first and second plates are configured to approximately cancel the first and second momenta.

Another preferred method of storing information in accordance with the present invention includes disposing a plurality of plates in a rectangular array of at least four pairs of plates. A top plate of a first pair of plates is aligned on a first common axis with a second plate of a second pair of plates. A bottom plate of the first pair of plates is aligned on a second common axis with a third plate of a third pair of plates. Such plate alignments on common axes provide offsetting momenta while avoiding creating undesirable torque forces, thereby minimizing vibration in the storage system.

Other aspects and advantages of the present invention will become apparent from the following detailed description, which in conjunction with the accompanying drawings illustrates by way of example the principles of the present invention.

DETAILED DESCRIPTION OF THE INVENTION

Figure 1:
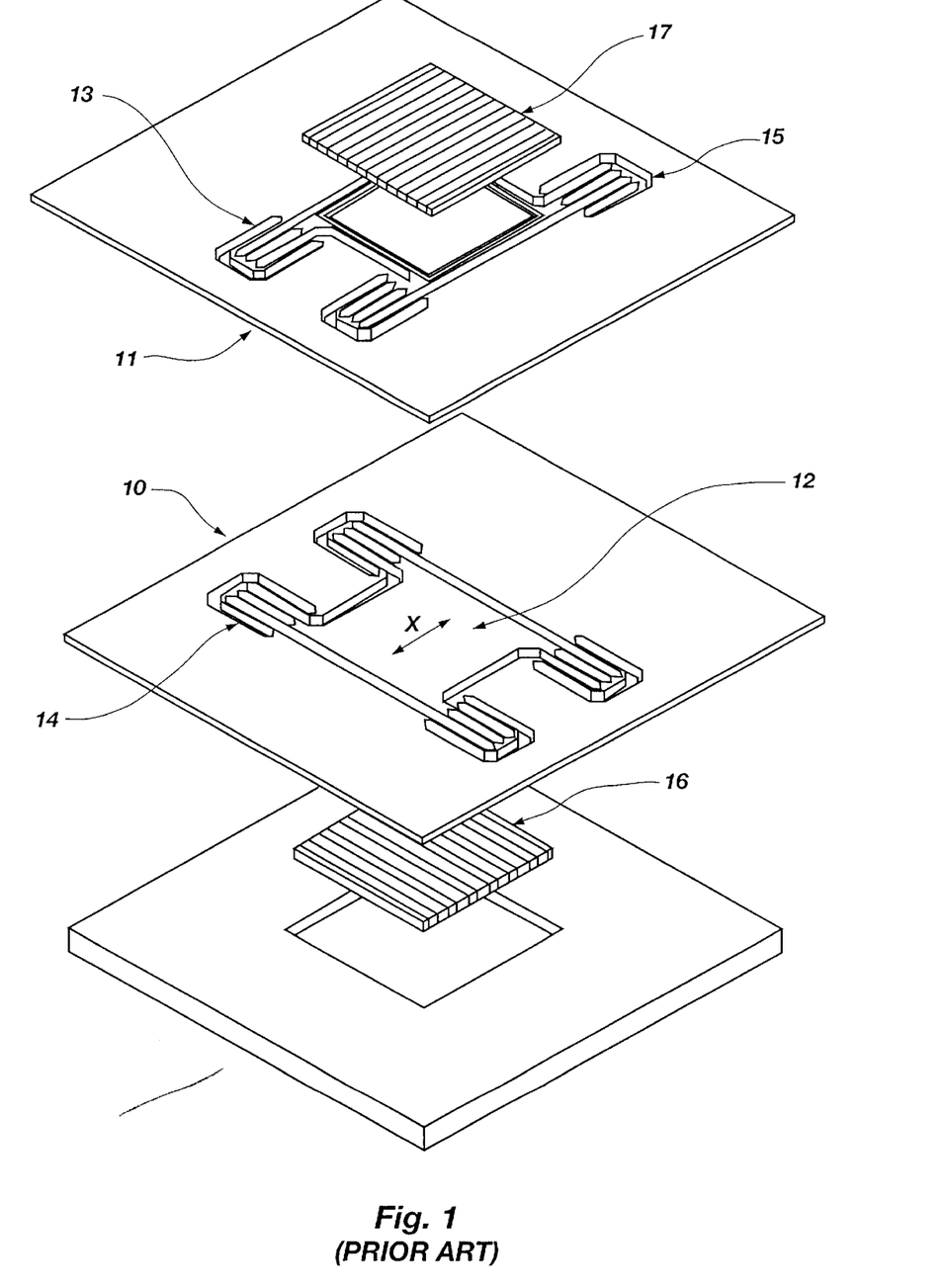
FIG. 1 is a prior art exploded perspective view showing the plates of one preferred embodiment of the present invention.

With reference first to FIG. 1, a prior art perspective view is provided of a pair of plates 10 and 11 in spaced planar relationship to each other with their axes of motion orthogonal to each other. Each plate includes a complement of silicon springs 14 and 15 that hold moving members 12 and 13 in suspension. Each moving member provides a surface on which a recording medium or a read/write device may be placed.

Magnetic drivers 16 and 17 are provided above and below moving members 12 and 13 respectively to move member 12 in one direction, arbitrary shown as the Y direction and to drive member 13 in a second orthogonal direction, shown as the X direction.

Figure 2:
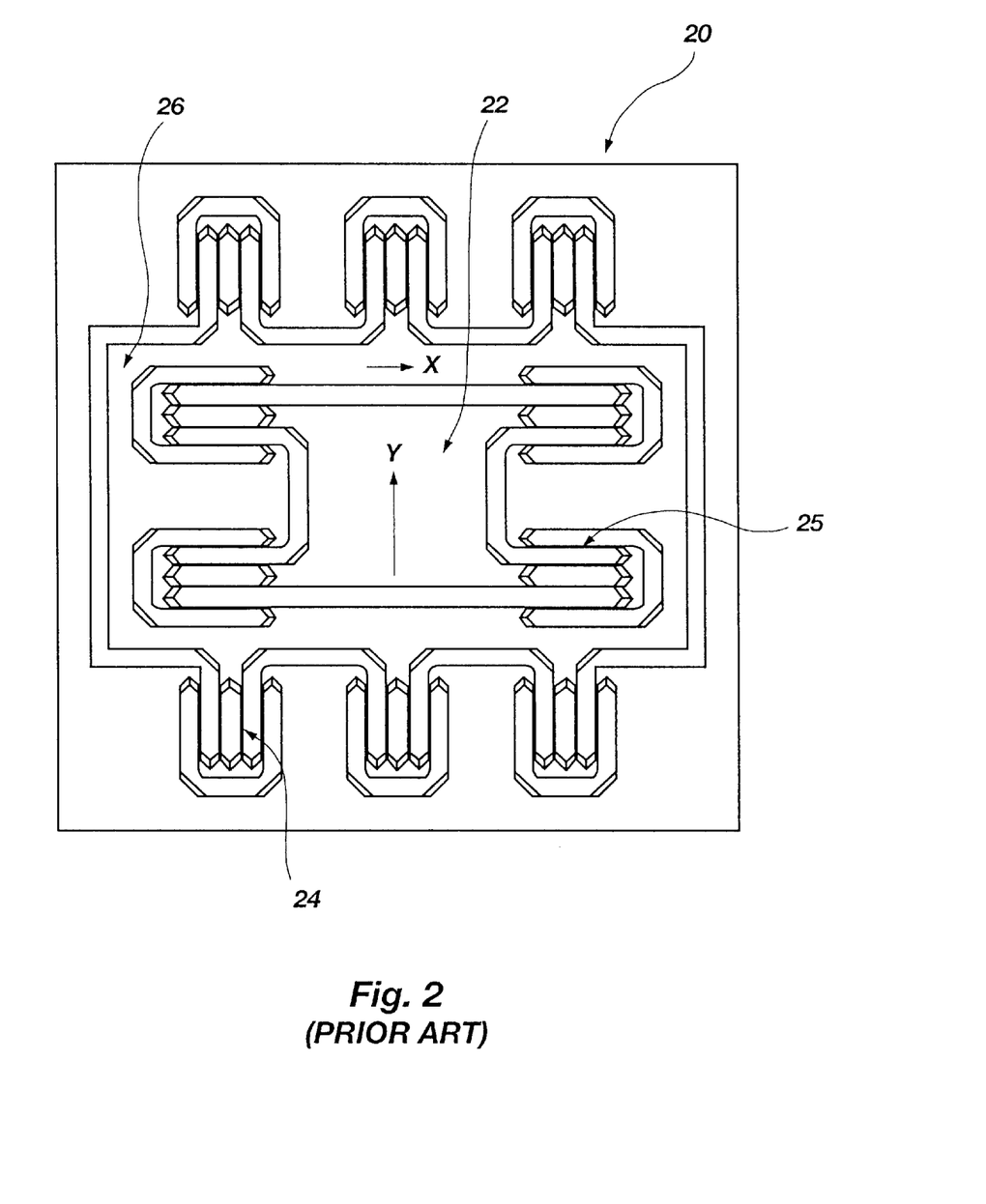
FIG. 2 is a prior art plan view showing another plate used in accordance to a second preferred embodiment of the present invention.

FIG. 2 shows an alternate embodiment in which a plate 20 is provided with a moveable plate 22 configured to move in both the X and Y directions by silicon springs 24 and 25 each mounted to respond to one of the directions of movement. An intermediate plate 26 is connected to springs 24 to move in the X direction and the interior moving plate 22 is connected to springs 25 to move in the Y direction.

Figure 3:
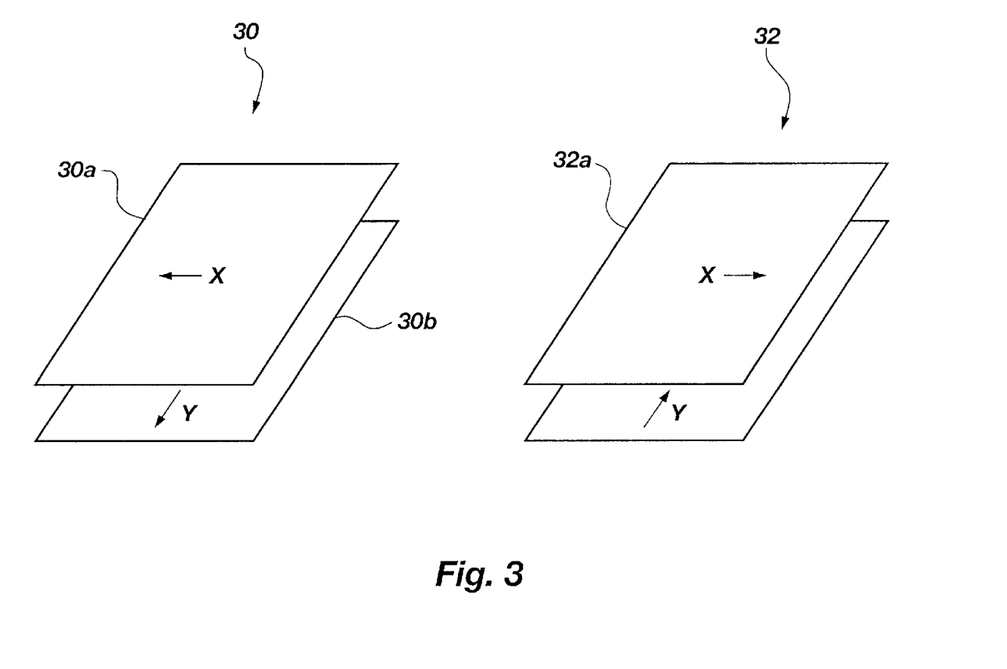
FIG. 3 is a schematic view illustrating movement of dual plate pairs in opposing directions.

FIG. 3 shows two pair of plates 30 and 32, illustrating the general concept of the present invention. Plates 30 and 32 are aligned along a common X axis and configured to move in opposing directions to each other. Plate 30a is configured to move along the X axis and Plate 30b is structured to move along the Y axis. Plate 32a is set up to move along the X axis in a direction opposite to the direction of movement of plate 30a. Likewise plate 32b is configured to move along the Y axis in a direction opposite to the direction of movement of plate 30b. The distance and time of movement of plates 30 preferably correspond to the distance and time of movement of plates 32. Plates 30 and 32 may be configured according to the structure shown in FIG. 1 or 2 or with other structure suitable for achieving the desired movement.

The plate pair shown in FIG. 3 provides some compensation for opposing movement of plates. The arrangement works completely with regard to compensation for movement in the east-west directions along the X axis. However, a torque or rotational force is established about the Z axis (vertical to the paper plane) by the opposing Y forces because the plates are not aligned on the Y axis. Likewise, plate pairs that are aligned on the Y axis but not on the X axis will create undesirable torque from opposing X forces. The structure of the plate pairs shown in FIG. 3 would preferably provide some compensation or flexibility against the torque forces to render them negligible.

Figure 4:
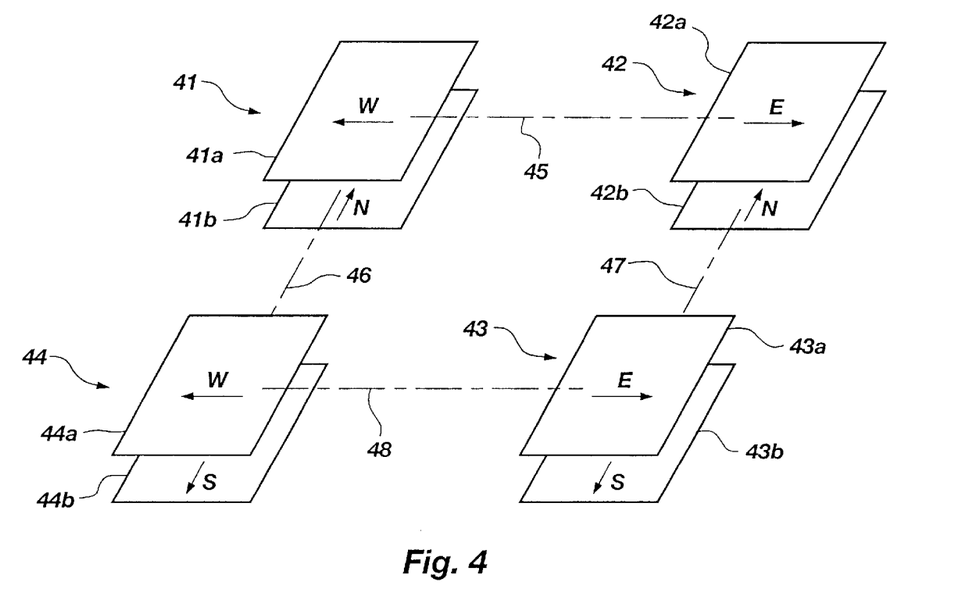
FIG. 4 is a schematic view showing one preferred movement of an array of four plates coordinated to move in opposing directions in accordance with the present invention.

Accordingly, although the grouping of two plate pairs as described above reduces a considerable amount of vibration, a group of at least four plate pairs is preferable to eliminate torque forces. FIG. 4 shows a logical schematic of a preferred embodiment of the present invention using a grouping of four plates aligned as described above. An array 40 of four pairs of plates 41–44 have opposing movements of each of the respective plates. The movement of each plate at a point in time is shown by the compass designations E, W, N, S for east, west, north and south. The directions designated are arbitrary and are used only for the purpose of showing relative motion.

As shown, each plate has a corresponding plate on the same axis having an opposing movement. Thus, plate pairs 41 and 42 are aligned on a first X axis 45, and plate pairs 43 and 44 are aligned on a second X axis 48. Likewise, plate pairs 41 and 44 are aligned on a first Y axis 46, and plate pairs 42 and 43 are aligned on a second Y axis 47. Preferably, the opposing motion of each plate pair is for the same mass moving at the same time for the same time period and distance at the same speed (total momentum), so that there is complete canceling of momentum and therefore minimization of any vibration caused by the motion of each plate separately.

Specifically, plate 41a moves west with the same total momentum that plate 42a is undergoing in a direction (east)

opposite to the direction of plate 41a. Accordingly, since plates 41a and 42a are aligned along X axis 45, the total motions of plates 41a and 42a cancel out the total momentum of each other and eliminate vibration on X axis 45. In a similar fashion, the total momentum of plate 41b in the direction of north is canceled by the total momentum of plate 44b to the south, since those two plates are aligned on Y axis 46.

Likewise, the total momentum of plate 42b to the north is canceled by the total momentum of plate 43b to the south along second Y axis 47. In a similar manner, the total momentum of plate 43a to the east is canceled by the total momentum of plate 44a to the west along second X axis 48.

Figure 5:
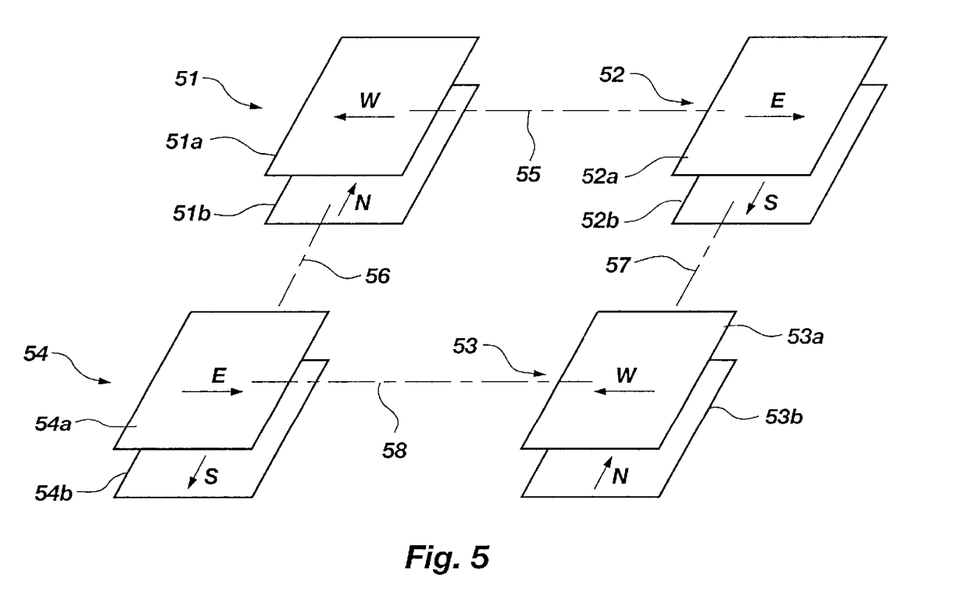
FIG. 5 is a schematic view showing another preferred movement of an array of four plates coordinated to move in opposing directions in accordance with the present invention.

FIG. 5 shows another similar configuration for balancing dynamics according to the present invention. An array 50 shows four pairs of plates 51–54 having opposing movements of each of the respective plates. Each plate pair is aligned on common X and Y axes with two other plate pairs. Each plate pair has a corresponding movement and an opposing movement with respect to each adjacent plate pair.

Specifically, plate pair 51a and 51b move west and north, respectively, at the same time and with the same momentum as plate pair 52a and 52b are moving east and south, respectively. Plate pair 53a and 53b move west and north, respectively, with the same total momentum as plate pair 54a and 54b moving east and south, respectively.

Accordingly, the total momentum of plates 51a and 52a cancel each other, since they are aligned on a first X axis 55. Likewise, the total momentum of plates 53a and 54a cancel each other, since they are aligned on a second X axis 58. In a similar manner, the total momentum of plates 51b and 54b cancel each other along a first Y axis 56, and the total momentum of plates 52b and 53b cancel each other along a second Y axis 57.

Other similar groupings of plate pairs may be achieved depending on the circumstances. For example, one plate in a pair might have both X and Y axis movement capability, as shown in FIG. 2, while the other plate in the pair could also have X and Y axis motion or be stationary. In such an arrangement, the motion of plate pairs would need to be designed to offset the motion of adjacent plate pairs, depending on their range and capability of motion.

It is understood that circuitry required to accomplish the foregoing plate pairs movements must be adapted to accommodate movement of plates in directions that may be different than standard plate motion. Such modifications may be made by a technician having ordinary skill in the art, and may be as simple as reversing wires for plates going in opposing directions. Accordingly, such circuitry design is within the scope of conventional circuitry and need not be further disclosed here.

Figure 6:
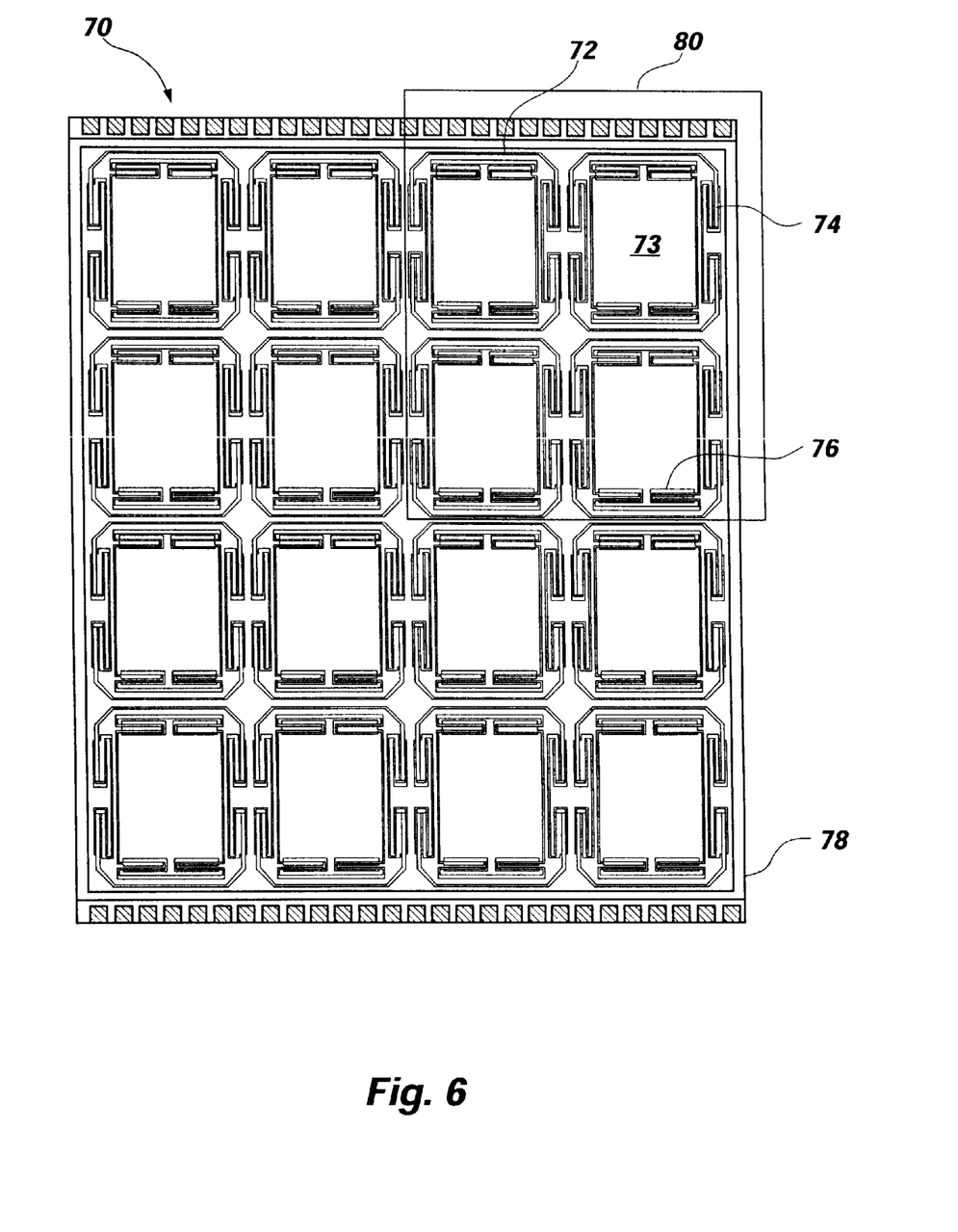
FIG. 6 is a top plan view showing a preferred embodiment of an array of 16 pairs of plates having X-Y motion in accordance with the present invention.

Referring now to FIG. 6, a top view is shown of a four by four array 70 of sixteen plates in accordance with another preferred embodiment of the present invention. Each plate 72 includes a moving portion 73 that is either a writing unit, such an array of emitters, or a recording unit, such as an array of information storage areas. Each plate 72 is equipped with micro movers to move the moving portion 73 of the plate 72 in both X and Y directions. X axis flexures 74 respond to movement of portion 73 along the X axis, and Y axis flexures 76 respond to movement of portion 73 along the Y axis. Power pads 78 for input and output circuitry for the XY drives extends around the periphery of the array 70.

The array 70 shown in FIG. 6 preferably includes at least one plate below the plates 72 that is paired with plate 72 to function as the writing unit or the recording unit, depending on the function of plate 72. Since plate 72 is movable in both X and Y directions, the other plate in each plate pair is preferably stationary. It is understood that a substantial number of layers of plates may be disposed below each plate 72, each plate associated with a plate pair functioning in accordance with the present invention, as described above.

Figure 7:
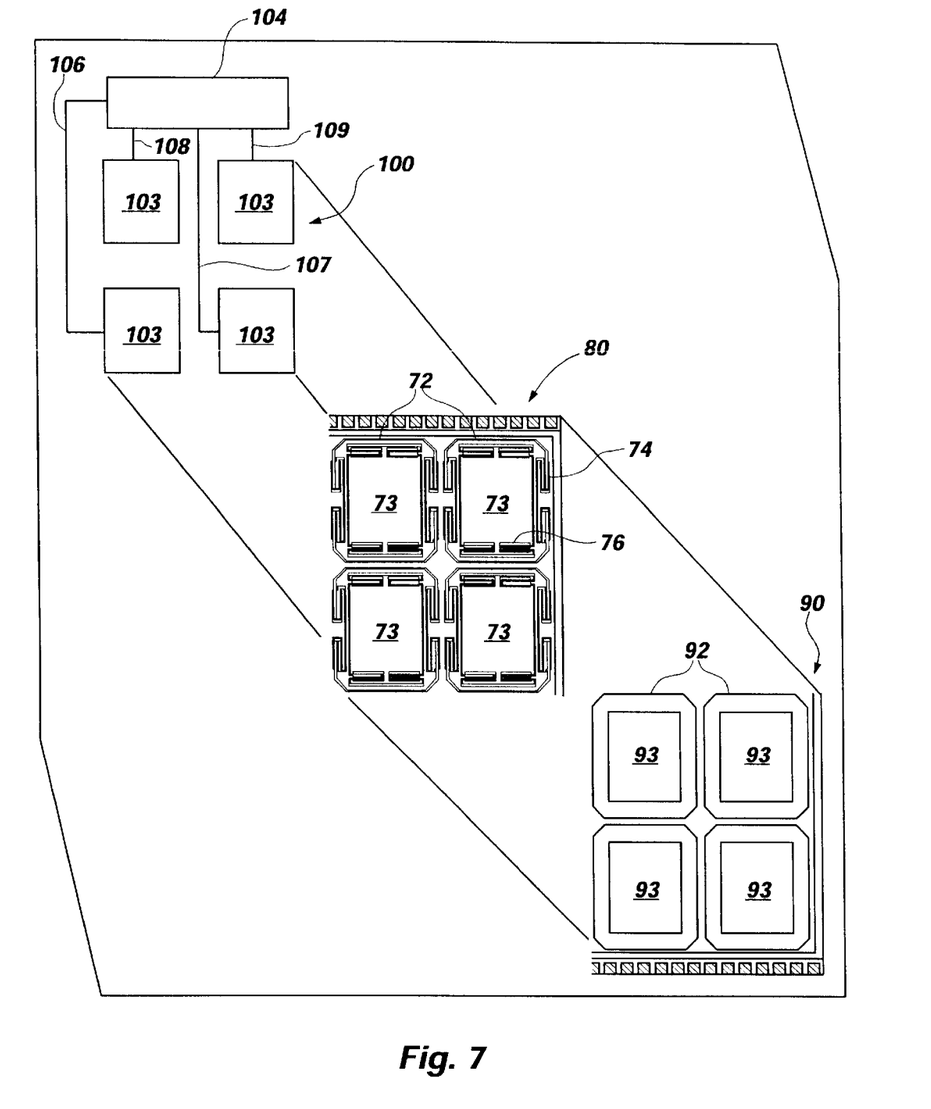
FIG. 7 is an exploded view of a part of the array shown in FIG. 6, including a portion the layer below and a portion of the MEMs above the array portion.

FIG. 7 shows an exploded partial view of the two-by-two segment 80 of the square array 70 of sixteen plates shown in FIG. 6. Each moving portion 73 includes a writing unit, such as an array of emitters, or a recording unit, such as an array of information storage areas. Below segment 80 is corresponding plate array segment 90 arranged so that array segments 80 and 90 have corresponding plate pairs, as discussed with regard to FIG. 6. For example, segment 90 is a two-by-two array of plates 92 each corresponding to one of respective plates 72. Each plate 92 includes an active portion 93, corresponding to one of the moving portions 73. Since the moving portions 73 of plates 72 are movable in both X and Y directions, the corresponding active portions 93 are preferably stationary. As stated above, each active portion 93 may be a writing unit or a recording unit for exchanging information with a corresponding moving portion 73, depending on the function performed by the moving portion 73.

A corresponding MEMs unit 100 is disposed above the array portion 80, functioning in essentially the same way as shown in FIG. 1. MEMs portion 100 comprises four MEMs 103 (similar to magnetic drivers 16 and 17 in FIG. 1), each controlling the motion of a respective moving portion 73 (similar to the moving members 12 and 13 in FIG. 1). Each MEM 103 is configured to move the respective moving portion 73 along either the X axis or the Y axis, as desired. Preferably, the X and Y motions of moving portions 73 of adjacent plates 72 move in opposite directions at the same time, as explained with respect to FIGS. 3, 4 and 5, so that each pair has a corresponding movement and an opposing movement.

A conventional control actuator or control circuitry 104 is connected to each MEM 103, as discussed above. Control actuator 104 has separate leads 106–109 running to each of the MEMs 103 to coordinate the movement of the moving portions 73 of the plates 72. Thus, as stated above and in the claims, the motion of one plate in a first direction occurs at the same time as the motion of adjacent plate in a second direction opposite to the first direction.

Other embodiments of the invention will be apparent to those skilled in the art from a consideration of this specification or practice of the invention disclosed herein. It is intended that the specification and examples be considered as exemplary only, with the true scope and spirit of the invention being indicated by the following claims.

We claim:

1. A micro-mover system, comprising:
   a first information storage unit including a first pair of parallel plates closely spaced from each other and disposed relative to each other to enable the exchange of information;
   a first micro electro-mechanical system (MEMS) motor associated with the first information storage unit to move at least one of the first pair of parallel plates in a first plane parallel to the other plate of the first pair to facilitate the exchange of information between the first pair of plates;
   a second information storage unit including a second pair of parallel plates closely spaced from each other and disposed relative to each other to enable the exchange of information, the second pair of parallel plates being oriented with respect to the first pair of parallel plates to develop counter movement in opposing directions;

a second MEMS motor associated with the second information storage unit to move at least one of the parallel plates along one of the opposing directions and in a second plane parallel to the other plate of the second pair to facilitate the exchange of information between the second pair of plates; and a control actuator associated with the first and second MEMS motors to coordinate the movement of the first and second pairs of plates so that the motion of the one of the second set of parallel plates along one of the opposing directions occurs at the same time and in a direction opposite to the movement of the one of the first set of parallel plates to thereby cancel a substantial level of total momentum arising from movement within the micro-mover system.

2. The micro-mover system as recited in claim 1, wherein the control actuator includes a distance control component to actuate the first and second MEMS motors so that the first pair of parallel plates moves approximately the same distance in the opposite direction as the second pair of parallel plates.

3. The micro-mover system as recited in claim 1, wherein the control actuator includes a timing control component to actuate the first and second MEMS motors so that the first pair of parallel plates moves at the same time as the second pair of parallel plates.

4. The micro-mover system as recited in claim 1, wherein one plate of each pair of parallel plates comprises an information storage device having a medium for storing information on said information storage device, and the other plate of each pair of parallel plates comprises a read/write device for providing information to an information storage device associated with the read/write device and obtaining information from the associated information storage device.

5. The micro-mover system as recited in claim 1, wherein the first and second pairs of plates each have integral suspension springs to support each respective plate.

6. A micro-mover system, comprising:

an array of multiple pairs of plates, each pair of plates having a data storage medium for storing information and being parallel to each other and in proximate close spacing with each other, one of each pair being moveable relative to the other plate;

a micro-mover for moving the moveable plate of each pair of plates in a direction parallel to the other plate of said pair to facilitate the exchange of information; and a control actuator associated with said micro-mover for controlling the movement of plates in each pair of plates so that a first number of the moveable plates are collectively moving in a first direction and a second number of the moveable plates are collectively moving in a second direction opposite to the first direction of the first portion of the moving plates at the same time as the movement of the first number of moving plates.

7. The micro-mover system as recited in claim 6 wherein the first number of moving plates in the first direction is the same as the second number of moving plates in the second direction.

8. The micro-mover system as recited in claim 6 wherein the first number of moving plates and the second number of moving plates comprise plate pairs, each plate pair moving in opposite directions along a common axis.

9. The micro-mover system as recited in claim 6 wherein the control actuator includes a distance-determining control that moves the first portion of the moving plates the same distance as the second portion of the moving plates.

10. The micro-mover system as recited in claim 6 wherein the control actuator includes a time determining control that moves the first portion of the moving plates at the same time as the second portion of the moving plates.

11. The micro-mover system as recited in claim 6 wherein the first and second portions each comprise half of the moveable plates.

12. The micro-mover system as recited in claim 6 wherein the array comprises a rectangular array of at least four pair of information storage plates, the plate pairs being disposed so that adjacent pairs of plates on each side of the rectangular array are aligned along a common axis, each pair of plates having a first plate that moves in a direction the same as a first plate in the adjacent pair and a second plate that moves in a direction opposite to a second plate in the adjacent pair.

13. The micro-mover system as recited in claim 6 wherein the array comprises a rectangular array of at least four pairs of information storage plates, the plate pairs being disposed so that adjacent pairs of plates on each side of the rectangular array are aligned for movement in the opposing directions, each pair of plates having a first plate that moves in a direction opposite to a first plate in the adjacent pair and a second plate that moves in a direction opposite to a second plate in the adjacent pair.

14. The micro-mover system as recited in claim 6 wherein the array comprises a rectangular array of at least four pair of information storage plates arranged so that adjacent pairs of plates along each side of the rectangular array each have a first plate that is stationary and a second plate that moves in a direction opposite to a second plate in the adjacent pair.

15. The micro-mover system as recited in claim 6 wherein the collective movement of the plate pairs in the first direction has approximately the same total momentum as the collective movement of the plate pairs in the second opposing direction.

16. The micro-mover system as recited in claim 15 wherein one of each of the plate pairs is aligned along an axis with one of an adjacent plate pair and the other of each of the plate pairs is aligned along another axis with one of an adjacent plate pair.

17. A method of storing information in a memory storage system having a plurality of pairs of plates, each pair of plates being associated with a micro-mover for moving at least one plate relative to the other plate in each pair of plates, comprising the steps of:

(a) moving at least a first plate in a first pair of plates in a first direction with a first momentum;

(b) moving at least a second plate in a second pair of plates in a direction opposite to the first direction with a second momentum approximately equal to the first momentum; and (c) configuring the movement of the first and second plates to approximately cancel the first and second momenta.

18. The method of storing information as recited in claim 17, wherein the first plate and the second plate are moved for approximately the same period of time along a common axis.

19. The method of storing information as recited in claim 17, wherein the first plate and the second plate are moved approximately the same distance.

20. The method of storing information as recited in claim 19, wherein the first and second plates are moved along a common axis.

21. The method of storing information as recited in claim 17, wherein the plurality of plates comprise an array of at least four pairs of plates disposed in a rectangular array, a top plate of a first pair of plates being aligned on a first common axis with a second plate of a second pair of plates.

22. The method of storing information as recited in claim 21 wherein a bottom plate of the first pair of plates is aligned on a second common axis with a third plate of a third pair of plates.

23. The method of storing information as recited in claim 22 comprising moving a first moveable plate of a first pair in the rectangular array along a first axis in a first direction for a first period of time, and moving a first moveable plate of a second pair in the rectangular array adjacent to the first pair along the first axis in a second direction opposite to the first direction for the first period of time.

24. The method of storing information recited in claim 23, comprising moving a second moveable plate of the first pair in the rectangular array along a second axis in a third direction for a second period of time, and moving a first moveable plate of a third pair in the rectangular array adjacent to the first pair along the second axis in a fourth direction opposite to the third direction for the second period of time.

* * * * *